(12) United States Patent
Guisan et al.

(10) Patent No.: US 12,550,623 B2
(45) Date of Patent: Feb. 10, 2026

(54) NITRIDE DIFFUSION BARRIER STRUCTURE FOR SPINTRONIC APPLICATIONS

(71) Applicant: Headway Technologies, Inc., Milpitas, CA (US)

(72) Inventors: Santiago Serrano Guisan, San Jose, CA (US); Luc Thomas, San Jose, CA (US); Jodi Mari Iwata, San Carlos, CA (US); Guenole Jan, San Jose, CA (US); Vignesh Sundar, Fremont, CA (US)

(73) Assignee: Headway Technologies, Inc., Milpitas, CA (US)

( * ) Notice: Subject to any disclaimer, the term of this patent is extended or adjusted under 35 U.S.C. 154(b) by 613 days.

(21) Appl. No.: 17/182,536

(22) Filed: Feb. 23, 2021

(65) Prior Publication Data

US 2021/0175414 A1 Jun. 10, 2021

Related U.S. Application Data

(62) Division of application No. 16/275,381, filed on Feb. 14, 2019, now Pat. No. 10,950,782.

(51) Int. Cl.
*H10N 50/80* (2023.01)
*H01F 10/32* (2006.01)
(Continued)

(52) U.S. Cl.
CPC ......... *H10N 50/80* (2023.02); *H01F 10/3259* (2013.01); *H01F 10/3286* (2013.01);
(Continued)

(58) Field of Classification Search
CPC . H01F 10/3259; H01F 10/3286; H01F 10/329
See application file for complete search history.

(56) References Cited

U.S. PATENT DOCUMENTS 3,847,510 A 11/1974 Fenne
6,166,948 A 12/2000 Parkin et al.
(Continued)

FOREIGN PATENT DOCUMENTS

JP 11337527 A 12/1999
JP 2005150303 A 6/2005
(Continued)

OTHER PUBLICATIONS

Zhang et al, Giant facet-dependent spin-orbit torque and spin Hall conductivity in the triangular antiferromagnet IrMn3, Sep. 30, 2016, Science Advances, e1600759, pp. 1-8. (Year: 2016).*
(Continued)

*Primary Examiner* — Vu A Vu
*Assistant Examiner* — Valerie N Newton
(74) *Attorney, Agent, or Firm* — Saile Ackerman LLC; Stephen B. Ackerman

(57) ABSTRACT

A magnetic tunnel junction (MTJ) is disclosed wherein a nitride diffusion barrier (NDB) has a L2/L1/NL or NL/L1/L2 configuration wherein NL is a metal nitride or metal oxynitride layer, L2 blocks oxygen diffusion from an adjoining Hk enhancing layer, and L1 prevents nitrogen diffusion from NL to the free layer (FL) thereby enhancing magnetoresistive ratio and FL thermal stability, and minimizing resistance x area product for the MTJ. NL is the uppermost layer in a bottom spin valve configuration, or is formed on a seed layer in a top spin valve configuration such that L2 and L1 are always between NL and the FL or pinned layer, respectively. In other embodiments, one or both of L1 and L2 are partially oxidized. Moreover, either L2 or L1 may be omitted when the other of L1 and L2 is partially oxidized. A spacer between the FL and L2 is optional.

24 Claims, 10 Drawing Sheets

(51) Int. Cl.
*H01F 41/34* (2006.01)
*H10N 50/01* (2023.01)
*H10N 50/85* (2023.01)

(52) U.S. Cl.
CPC ............. *H01F 41/34* (2013.01); *H10N 50/01* (2023.02); *H10N 50/85* (2023.02); *H01F 10/329* (2013.01)

(56) References Cited

U.S. PATENT DOCUMENTS

| | | | |
|---|---|---|---|
| 6,544,801 | B1 | 4/2003 | Slaughter et al. |
| 6,743,503 | B1 | 6/2004 | Chen |
| 6,834,005 | B1 | 12/2004 | Parkin |
| 6,974,708 | B2 | 12/2005 | Horng et al. |
| 7,183,120 | B2 | 2/2007 | Berg et al. |
| 7,335,961 | B2 | 2/2008 | Guo et al. |
| 7,486,551 | B1 | 2/2009 | Li et al. |
| 7,576,956 | B2 | 8/2009 | Huai |
| 7,586,781 | B2 | 9/2009 | Saitoh et al. |
| 7,630,232 | B2 | 12/2009 | Guo |
| 7,742,263 | B2 | 6/2010 | Fukumoto et al. |
| 7,817,462 | B2 | 10/2010 | Miura et al. |
| 7,863,060 | B2 | 1/2011 | Belen et al. |
| 7,902,579 | B2 | 3/2011 | Lim et al. |
| 7,936,627 | B2 | 5/2011 | Fukami |
| 8,009,464 | B2 | 8/2011 | Kajiyama |
| 8,379,429 | B2 | 2/2013 | Ishiwata et al. |
| 8,470,462 | B2 | 6/2013 | Horng et al. |
| 8,580,583 | B2 | 11/2013 | Lee et al. |
| 8,592,927 | B2 | 11/2013 | Jan et al. |
| 8,921,961 | B2 | 12/2014 | Kula et al. |
| 9,006,704 | B2 | 4/2015 | Jan et al. |
| 9,048,411 | B2 | 6/2015 | Jan et al. |
| 9,368,551 | B2 | 6/2016 | Masuoka et al. |
| 9,614,258 | B2 | 4/2017 | Takahashi et al. |
| 9,711,202 | B2 | 7/2017 | Kim et al. |
| 9,966,529 | B1 | 5/2018 | Iwata et al. |
| 10,014,465 | B1 | 7/2018 | Liu |
| 10,522,746 | B1* | 12/2019 | Sundar ................... H10N 50/85 |
| 10,665,773 | B2 | 5/2020 | Iwata et al. |
| 10,950,782 | B2* | 3/2021 | Guisan ................ H01F 10/3259 |
| 2004/0252539 | A1 | 12/2004 | Parkin |
| 2007/0253122 | A1 | 11/2007 | Fukuzawa et al. |
| 2008/0026253 | A1 | 1/2008 | Yuasa |
| 2008/0137405 | A1 | 6/2008 | Ohno et al. |
| 2008/0204946 | A1 | 8/2008 | Ochiai et al. |
| 2008/0278867 | A1 | 11/2008 | Fukumoto et al. |
| 2009/0213503 | A1 | 8/2009 | Sun et al. |
| 2009/0257151 | A1 | 10/2009 | Zhang et al. |
| 2009/0303779 | A1 | 12/2009 | Chen et al. |
| 2010/0020592 | A1 | 1/2010 | Hosotani |
| 2010/0072524 | A1 | 3/2010 | Huai et al. |
| 2010/0090261 | A1 | 4/2010 | Zheng et al. |
| 2011/0014500 | A1 | 1/2011 | Horng et al. |
| 2012/0023386 | A1 | 1/2012 | Oh et al. |
| 2012/0205758 | A1 | 8/2012 | Jan et al. |
| 2012/0280336 | A1 | 11/2012 | Jan |
| 2013/0221460 | A1 | 8/2013 | Jan |
| 2014/0291663 | A1 | 10/2014 | Kuo |
| 2014/0355152 | A1 | 12/2014 | Park et al. |
| 2015/0008547 | A1* | 1/2015 | Pi ........................... H10B 61/00 257/421 |
| 2016/0211442 | A1 | 7/2016 | Cao et al. |
| 2016/0284763 | A1 | 9/2016 | Tahmasebi et al. |
| 2017/0084836 | A1 | 3/2017 | Kim et al. |
| 2017/0338021 | A1 | 11/2017 | Xiao |
| 2017/0338402 | A1* | 11/2017 | Hu ......................... H10N 50/01 |
| 2018/0005746 | A1 | 1/2018 | Thomas et al. |
| 2019/0237661 | A1 | 8/2019 | Iwata |
| 2019/0393410 | A1* | 12/2019 | Lee ........................ H10B 61/10 |
| 2020/0006626 | A1 | 1/2020 | Smith |
| 2020/0220073 | A1* | 7/2020 | Marchack ............. H10N 50/01 |
| 2020/0251652 | A1* | 8/2020 | Hashemi ................ H10N 50/80 |
| 2020/0388425 | A1* | 12/2020 | Jung ...................... H10N 50/01 |

FOREIGN PATENT DOCUMENTS

| | | |
|---|---|---|
| JP | 2007123640 A | 5/2007 |
| WO | 2007015474 A1 | 2/2007 |
| WO | 2009101827 A1 | 8/2009 |

OTHER PUBLICATIONS

"Current-driven excitation of magnetic multilayers," by J.C. Slonczewski, Journal of Magnetism and Magnetic Materials 159, L-1-L-7, Elsevier, Jun. 1996.

"A perpendicular-anisotropy CoFeB—MgO magnetic tunnel junction," by S. Ikeda et al., Nature materials, Published online: Jul. 11, 2010/ DOI: 10.1038/NMAT2804, www.nature.com/naturematerials, pp. 1-4.

Current-induced domain wall motion in perpendicularly magnetized CoFeB nanowire, by S. Fukami et al., Applied Physics Letters 98, 082504 (2011), Feb. 2011, doi: http://dx.doi.org/10.1063/1.3558917, pp. 1-3.

"Growth, structure, electroic, and magnetic properties of MgO/Fe(001) bilayers and Fe/MgO/Fe(001) trilayers," by M. Klaua et al., Physical Review B, vol. 64, 134411, Sep. 2001, pp. 1-8.

US Office Action, U.S. Appl. No. 16/275,381, Applicant: Guisan et al., Mail date: Mar. 23, 2020, 9 pages.

US Office Action, U.S. Appl. No. 15/881,035, Applicant: Iwata et al., Mail date: Oct. 4, 2019, 5 pages.

US Office Action, U.S. Appl. No. 15/881,035, Applicant: Iwata et al., Mail date: Mar. 21, 2019, 17 pages.

US Notice of Allowance, U.S. Appl. No. 16/275,381, Applicant: Guisan et al., Mail date: Oct. 30, 2020, 8 pages.

US Notice of Allowance, U.S. Appl. No. 15/881,035, Applicant: Iwata et al., Mail date: Jan. 15, 2020, 14 pages.

US Notice of Allowance, U.S. Appl. No. 15/461,779, Applicant: Iwata et al., Mail date: Jan. 17, 2018, 9 pages.

\* cited by examiner

| Element | Oxide | Free energy of formation per mol of $O_2$ ($\times 10^{-6}$ J.kmol-1) |
|---|---|---|
| Au | $Au_2O_3$ | 109 |
| Ag | $Ag_2O_3$ | -7 |
| Ru | $RuO_2$ | -253 |
| Cu | CuO | -254 |
| Co | CoO | -426 |
| Ni | NiO | -432 |
| Fe | FeO | -488 |
| Fe | $Fe_2O_3$ | -495 |
| Mo | $MoO_2$ | -502 |
| W | $WO_3$ | -509 |
| Sn | SnO | -514 |
| Zn | ZnO | -636 |
| Cr | $Cr_2O_3$ | -699 |
| Nb | $Nb_2O_5$ | -708 |
| Ta | $Ta_2O_5$ | -788 |
| B | $B_2O_3$ | -796 |
| Si | $SiO_2$ | -805 |
| Mn | $Mn_2O_3$ | -854 |
| Ti | $TiO_2$ | -890 |
| Zr | $ZrO_2$ | -1037 |
| Al | $Al_2O_3$ | -1053 |
| Ba | BaO | -1056 |
| Hf | $HfO_2$ | -1084 |
| Mg | MgO | -1146 |
| Ca | CaO | -1208 |

*FIG. 12*

NITRIDE DIFFUSION BARRIER STRUCTURE FOR SPINTRONIC APPLICATIONS

This is a divisional application of U.S. patent application Ser. No. 16/275,381; filed on Feb. 14, 2019, which is herein incorporated by reference in its entirety, and assigned to a common assignee.

RELATED PATENT APPLICATIONS

This application is related to the following: U.S. Pat. No. 9,966,529; and Ser. No. 15/881,035, filing date Jan. 26, 2018; which are assigned to a common assignee and herein incorporated by reference in their entirety.

TECHNICAL FIELD

The present disclosure relates to a magnetic tunnel junction (MTJ) comprised of a free layer that interfaces with a tunnel barrier layer and a spacer such as a Hk enhancing layer, and having a nitride diffusion barrier (NDB) contacting the spacer to prevent oxygen diffusion out of the Hk enhancing layer, and to block nitrogen diffusion through the Hk enhancing layer to the free layer thereby improving the magnetoresistive ratio (DRR) and thermal stability, and enabling a lower resistance x area (RA) value.

BACKGROUND

MTJ thin films are essential elements for future Spin Transfer Torque Magnetic Random Access Memories (STT-MRAM) and other spintronic applications such as spin torque oscillators (STO), magnetic domain wall devices, and magnetic field sensors. Spin-transfer torque (STT) magnetization switching was described by J. C. Slonczewski in "Current driven excitation of magnetic multilayers", J. Magn. Magn. Mater. V 159, L1-L7 (1996), and has led to the development of spintronic devices such as STT-MRAM on a gigabit scale.

STT-MRAM has a MTJ cell based on a tunneling magnetoresistance (TMR) effect wherein a stack of layers has a configuration in which two ferromagnetic (FM) layers are separated by a thin non-magnetic dielectric layer. One of the FM layers is a pinned layer having a magnetic moment that is fixed in a first direction while the other FM layer is called a free layer (FL) and has a magnetic moment that is free to rotate in a direction parallel (P state) or anti-parallel (AP state) to the first direction corresponding to a "0" or "1" magnetic state, respectively. Compared with conventional MRAM, STT-MRAM has an advantage in avoiding the half select problem and writing disturbance between adjacent cells. The spin-transfer effect arises from the spin dependent electron transport properties of ferromagnetic-spacer-ferromagnetic multilayers. When a spin-polarized current traverses a magnetic multilayer in a current perpendicular to plane (CPP) direction, the spin angular momentum of electrons incident on a FL layer interacts with magnetic moments of the FL layer near the interface between the FL layer and non-magnetic spacer. Through this interaction, the electrons transfer a portion of their angular momentum to the FL. As a result, spin-polarized current can switch the magnetization direction of the FL if the current density is sufficiently high, and if the dimensions of the multilayer are small.

P-MTJs are MTJ cells with perpendicular magnetic anisotropy (PMA) in the pinned layer and FL, and are the building blocks that enable STT-MRAM and other spintronic devices. Typically, there is a non-magnetic tunneling oxide layer called a tunnel barrier layer between the pinned layer and FL. When the FL has PMA, the critical current ($i_C$) needed to switch the FL and p-MTJ from a P state to an AP state, or vice versa, is directly proportional to the perpendicular anisotropy field as indicated in equation (1) where e is the electron charge, $\alpha$ is a Gilbert damping constant, Ms is the FL saturation magnetization, h is the reduced Plank's constant, g is the gyromagnetic ratio, and $H_{k_{eff},\perp}$ is the out-of-plane anisotropy field of the magnetic region to switch, and V is the volume of the free layer:

$$i_c = \frac{\alpha e M s V H_{k_{eff},\perp}}{gh} \quad (1)$$

The value $\Delta=kV/k_BT$ is a measure of the thermal stability of the FL where kV is also known as $E_b$ or the energy barrier between the P and AP magnetic states, $k_B$ is the Boltzmann constant and T is the temperature. Thermal stability is a function of the perpendicular anisotropy field as shown in equation (2):

$$\Delta = \frac{M_S V H_{k_{eff},\perp}}{2k_B T} \quad (2)$$

The perpendicular anisotropy field (Hk) of the FL is expressed in equation (3) as:

$$H_{k_{eff},\perp} = -4\pi M_S + \frac{2K_U^{\perp,S}}{M_S d} + H_{k,\perp} \quad (3)$$

where $M_s$ is the saturation magnetization, d is the thickness of the free layer, $H_{k,\perp}$ is the crystalline anisotropy field in the perpendicular direction, and $K_U^{\perp,S}$ is the surface perpendicular anisotropy of the top and bottom surfaces of the FL. Since most spintronic applications like embedded non-volatile memory (eNVM) devices need to be integrated into standard Complementary Metal Oxide Semiconductor (CMOS) processes, the devices including the p-MTJ cells therein must be able to withstand 400° C. temperatures during annealing for up to 5 hours. High temperature anneal conditions combined with highly mobile oxygen in the oxide tunnel barrier, and other oxide layers when present, typically results in a loss of PMA and degraded FL properties.

CoFeB/MgO (FL/tunnel barrier) based MTJ structures enable considerable thermal stability because of PMA induced at the FL/oxide interface, and also provide acceptable DRR, low writing voltage (Vwrite), and good reliability to satisfy most STT-MRAM performance requirements. However, improved thermal stability is desired, and to meet that demand a second metal oxide interface with the FL is introduced by sandwiching the FL between the tunnel barrier and a Hk enhancing layer to generate higher surface perpendicular anisotropy in equation (3). Unfortunately, there is an increase in RA, and a reduction in DRR because of the parasitic serial resistance contribution of the Hk enhancing layer. In order to minimize RA and the tradeoff in lower DRR, the Hk enhancing layer is underoxidized, which means a plurality of metal atoms in the lattice is not oxidized. However, this modification leads to an unwanted side effect where oxygen vacancies in the lattice allow for increased mobility of oxygen within the Hk enhancing layer and to/from adjacent layers as well as intermixing with adjoining layers, and diffusion of metal or nitrogen species into the FL.

Although various barriers including a nitride barrier between the Hk enhancing layer and a hard mask have been proposed, none have been able to completely prevent nitrogen diffusion from the nitride barrier and metals from the hard mask (when present) to the FL. Thus, an improved nitride barrier structure is needed to essentially eliminate nitrogen diffusion into the free layer while preventing oxygen diffusion out of the Hk enhancing layer so that FL thermal stability is enhanced while providing DRR and RA values required for high magnetic performance in advanced memory designs wherein a critical dimension (FL width) is substantially less than 100 nm.

SUMMARY

One objective of the present disclosure is to provide a p-MTJ wherein there is an improved nitride diffusion barrier (NDB) that serves as one or both of a capping layer, and barrier on a seed layer that prevents the migration of metals and nitrogen to the free layer.

A second objective is to provide an improved NDB according to the first objective that also substantially minimizes oxygen diffusion out of a Hk enhancing layer that interfaces with the free layer.

A third objective is to provide a method of forming the p-MTJ according to the first two objectives with a process flow that is compatible with CMOS fabrication.

According to one embodiment, these objectives are achieved by providing a NDB that contacts a Hk enhancing layer in a p-MTJ with a bottom spin valve configuration. In one preferred embodiment, the NDB has a lower layer (L2), a middle layer (L1) and an upper metal nitride (MN) or metal oxynitride (MON) layer where L2 prevents oxygen diffusion from the Hk enhancing layer to L1, and L1 blocks nitrogen diffusion from the nitride layer (NL=MN or MON) to the FL. Thus, an optional seed layer, pinned layer, tunnel barrier layer, FL, Hk enhancing layer, and the NDB are sequentially formed on a substrate that may be a bottom electrode (BE). In an alternative embodiment, the Hk enhancing layer is omitted. Moreover, a second NDB with a NL/L1/L2 stack may be formed between the seed layer and pinned layer. In the second NDB, the stacking order is reversed such that L2 is the uppermost layer and adjoins the pinned layer.

In other embodiments, both of L1 and L2 may be partially oxidized to yield a L1ox/L2ox/NL, L1/L2ox/NL, or a L1ox/L2/NL NDB configuration. Furthermore, either of L1ox or L2ox may be omitted to provide a bilayer NDB having a L2ox/NL or a L1ox/NL configuration.

The present disclosure also encompasses embodiments where the NDB is formed between the seed layer and free layer in a top spin valve p-MTJ. For example, the p-MTJ may have a seed layer/NDB/Hk enhancing layer/FL/tunnel barrier layer/pinned layer/capping layer configuration.

According to a first embodiment, the metal nitride or metal oxynitride in the NDB has a M1N or M1ON composition wherein M1 is selected from Ti, Zr, Hf, V, Nb, Ta, Cr, Mo, Mg and W to afford a conductive M1N or M1ON that is beneficial in minimizing RA compared with a corresponding metal oxide (M1 oxide).

According to a second embodiment, the metal nitride or metal oxynitride in the NDB is comprised of an insulating metal (M2) nitride or oxynitride where M2 is one of B, Al, Si, Ga, In, or Tl that is alloyed with a conductive metal or alloy (M3) selected from one or more of Pt, Au, Ag, Mg, Ca, Sr, Ba, Sc, Y, La, Co, Fe, Mn, Ru, Rh, Ir, Ni, Pd, Zn, Cu, Ti, V, Cr, Zr, Nb, Mo, Hf, Ta, and W to impart conductivity to the resulting M2M3 nitride (M2M3N), or M2M3 oxynitride (M2M3ON). Alternatively, the insulating M2N or M2ON layer has conductive pathways formed therein that are made of one or more of the M3 metals or alloys.

In all embodiments, L1 is preferably a material with a low free energy of nitride formation and is one of Zr, Ti, Ta, V, and Nb that also has a low to medium free energy of oxide formation. L2 is preferably one of Mo, Nb, Ta, Ag, Ru, Pt, or W and has a high to medium free energy of oxide formation, which is higher than that of L1. Thus, L2 is more difficult to oxidize than L1.

The present disclosure also encompasses a method of fabricating a p-MTJ having a NDB with a structure according to one of the aforementioned embodiments. Typically, M1N, M1ON, M2M3N, and M2M3ON layers are sputter deposited in a single step. However, a multistep process may be employed where M1 or M2M3 layers are first sputter deposited, and then a second step involving nitridation or oxynitridation is used to form the nitride or oxynitride, respectively. Formation of M3 conductive paths within a M2N or M2ON layer is accomplished by a sequence of steps of (1) depositing a M3 layer, (2) depositing a M2 layer on the M3 layer, and (3) performing a nitridation or oxynitridation with plasma, or by a first step of ion implantation and a second step that is an anneal process.

BRIEF DESCRIPTION OF THE DRAWINGS

FIG. 12 is a table listing free energy of oxide formation for various metals.

DETAILED DESCRIPTION

The present disclosure is a p-MTJ structure and a method of making the same wherein one or two NDBs are employed to prevent oxygen diffusion out of a spacer that is typically a Hk enhancing layer, and block nitrogen diffusion into the free layer thereby enhancing thermal stability and DRR, and minimizing RA. Exemplary embodiments depict p-MTJ structures having bottom spin valve, top spin valve, or dual spin valve configurations. The p-MTJ may be incorporated in a MRAM, STT-MRAM, spin orbit torque (SOT)-MRAM, or other spintronic devices such as a spin torque oscillator, Spin Hall Effect device, magnetic sensor, and a biosensor. A thickness of each p-MTJ layer is in a z-axis direction, and the planes of each layer are formed in the x-axis and y-axis directions. The term "partially oxidized" may be used interchangeably with the term "non-stoichiometric oxidation state" when referring to the oxygen content in a layer.

In related U.S. Pat. No. 9,966,529, we disclosed a p-MTJ structure wherein a free layer forms a first interface with a first oxide layer (tunnel barrier layer), and a second interface with a second oxide layer (Hk enhancing layer) that is preferably MgO in order to increase PMA and thermal stability. In addition, a TiN barrier layer is inserted between the Hk enhancing layer and overlying hard mask to preserve the integrity of the MgO layer. However, energy dispersive X-ray spectroscopy (EDS) revealed extensive interdiffusion at the MgO/TiN interface indicating oxygen in the TiN layer, and N present in the FL.

In related patent application Ser. No. 15/881,035, we disclosed a NDB designed to substantially reduce oxygen diffusion from a Hk enhancing layer and significantly minimize metal or nitrogen diffusion from a nitride capping layer through the Hk enhancing layer into the FL. In particular, the NDB is a bilayer having a lower conductive metal buffer layer on the Hk enhancing layer, and an upper MN or MON layer. Although the NBD shows an improvement as a barrier to oxygen and nitrogen diffusion, we found that one cannot rely on a single buffer layer to completely block both oxygen and nitrogen diffusion. We have now discovered a modified NDB wherein the oxygen and nitrogen blocking capability is optimized by having two different layers between the FL and MN or MON capping layer to afford a considerable improvement in FL integrity and p-MTJ performance.

Figure 1:
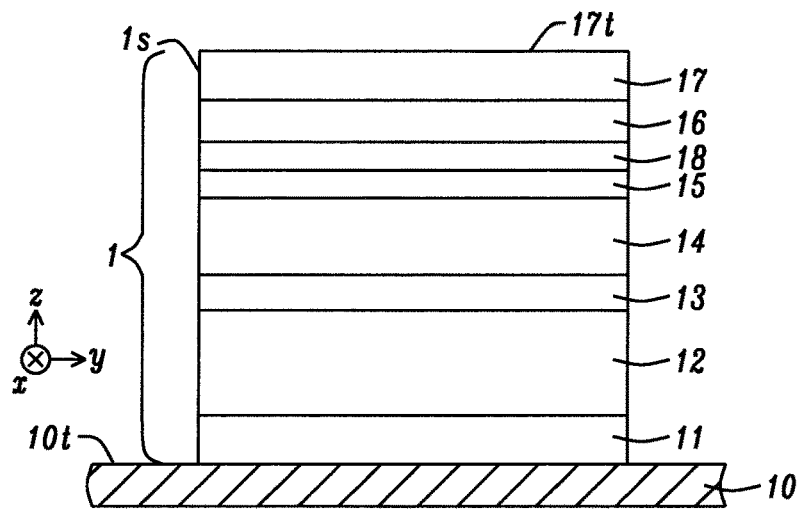
FIG. 1 is a cross-sectional view showing a magnetic tunnel junction (p-MTJ) having a nitride barrier layer between a Hk enhancing layer and a hard mask according to a process of record (POR) known to the inventors.

Referring to FIG. 1, a p-MTJ 1 (hereinafter called the Reference) that was disclosed in related patent application Ser. No. 15/881,035 is depicted, and has a bottom spin valve configuration wherein an optional seed layer 11, pinned layer 12, tunnel barrier layer 13, FL 14, Hk enhancing layer 15, metallic buffer layer 18, MN or MON layer 16, and capping layer 17 are sequentially formed on a substrate 10. In some embodiments, the substrate may be a bottom electrode (BE) in a STT-MRAM or another spintronic device. The BE is typically embedded in an insulation layer (not shown) and is electrically connected to a bit line or word line (not shown) that is driven by an underlying transistor. As mentioned above, a key feature is a NBD with a lower metallic buffer layer and an upper MN or MON layer.

Seed layer 11 is a single layer or multilayer and may be comprised of one or more of NiCr, Ta, Ru, Ti, TaN, Cu, Mg, or other materials typically employed to promote a smooth and uniform grain structure in overlying layers. Pinned layer 12 may have a SyAP configuration represented by AP2/AFC layer/AP1 where an AF coupling (AFC) layer made of Ru, Rh, or Ir, for example, is sandwiched between an AP2 magnetic layer and an AP1 magnetic layer (not shown). The AP2 layer contacts the seed layer (or BE) while the AP1 layer adjoins the tunnel barrier layer 13. AP1 and AP2 layers may be comprised of CoFe, CoFeB, Co, or a combination thereof. In other embodiments, the pinned layer may be a laminated stack with inherent PMA such as $(Co/Ni)_n$, $(CoFe/Ni)_n$, $(Co/NiFe)_n$, $(Co/Pt)_n$, $(Co/Pd)_n$, or the like where n is the lamination number. Furthermore, a transitional layer such as CoFeB or Co may be inserted between the uppermost layer in the laminated stack and the tunnel barrier layer.

Tunnel barrier layer 13 is preferably MgO that is formed by sputter depositing a MgO target, or by depositing one or more Mg layers and then oxidizing one or more Mg layers with a known radical oxidation (ROX) or natural oxidation (NOX) method. However, other metal oxides, or metal oxynitrides known in the art may be employed with or instead of MgO. For example, the tunnel barrier may be comprised of $Al_2O_3$, MgAlO, TiOx, AlTiO, MgZnO, $Al_2O_3$, ZnO, ZrOx, HfOx, or MgTaO. The present disclosure also anticipates that the tunnel barrier may be a lamination of one or more of the aforementioned metal oxides.

FL 14 has a thickness from 2 Angstroms to 100 Angstroms, and preferably 5 Angstroms to 30 Angstroms and is a single layer or a multilayer that is one or more of Co, Fe, CoFe, CoFeB, CoB, and FeB, or alloys thereof including CoFeNi and CoFeNiB. Moreover, there may be a metallic insertion layer with a thickness from 0.2 Angstroms to 10 Angstroms that is one or more of Al, Au, Ag, Mg, Ca, Sr, Ba, Sc, Y, La, Mn, Ru, Rh, Ir, Pd, Zn, Cu, Ti, V, Cr, Zr, Nb, Mo, Hf, Ta, W, or Pt in the FL. In other embodiments, the FL may be comprised of a material with a high crystalline anisotropy energy constant (Ku) having inherent PMA including Heusler alloys, ordered $L1_0$ or $L1_1$ materials, and rare-earth alloys. Heusler alloys include $Ni_2MnZ$, $Pd_2MnZ$, $Co_2MnZ$, $Fe_2MnZ$, $Co_2FeZ$, $Mn_3Ge$, $Mn_2Ga$, and the like where Z is one of Si, Ge, Al, Ga, In, Sn, and Sb. Ordered $L1_0$ or $L1_1$ materials have a composition such as MnAl, MnGa, and RT wherein R is Rh, Pd, Pt, Ir, or an alloy thereof, and T is Fe, Co, Ni or an alloy thereof. Rare-earth alloys include but are not limited to TbFeCo, GdCoFe, FeNdB, and SmCo.

As a result of this configuration where a tunnel barrier (metal oxide) 13 and Hk enhancing layer (metal oxide) 15 form first and second interfaces with bottom and top surfaces, respectively, of FL 14, there is strong perpendicular surface anisotropy, $K_{U1}^{\perp,S}$ and $K_{U2}^{\perp,S}$ at the first and second interfaces, respectively, that contribute to enhancing the term $K_U^{\perp,S}$ in equation (3) mentioned earlier.

Hk enhancing layer 15 is a metal oxide or metal oxynitride layer having a thickness and oxidation state that are controlled to give a RA product smaller than that of a MgO layer in tunnel barrier layer 13 in order to minimize a decrease in DRR. Thus, the Hk enhancing layer may be a single layer or laminate that is an oxide or oxynitride of one or more of Mg, Si, Ti, Ba, Ca, La, Al, Mn, V, and Hf. Moreover, the Hk enhancing layer may be a laminated layer comprised of one or more of the metal oxides or oxynitrides described above. In all embodiments, the Hk enhancing layer may have stoichiometric or non-stoichiometric oxygen content. Stoichiometric is defined as an oxidation state where essentially all non-metal lattice sites in a metal oxide are occupied by oxygen while in a non-stoichiometric oxidation state there is a plurality of unoccupied lattice sites.

Metal nitride or metal oxynitride layer also referred to as NL 16 comprises a metal or alloy (M1) where the metal or alloy is preferably one or more of Ti, Zr, Hf, V, Nb, Ta, Cr, Mo, Mg, and W to afford a conductive nitride (M1N) or oxynitride (M1ON) to minimize a RA contribution to the p-MTJ. Note that the total RA value for the p-MTJ is determined by a contribution from each of the metal oxide and metal nitride/oxynitride layers and is represented by the equation $RA_{TOTAL} = (RA_{13} + RA_{15} + RA_{16})$ where $RA_{13}$, $RA_{15}$, and $RA_{16}$ are the RA product for the tunnel barrier layer, Hk enhancing layer, and M1N or M1ON layer, respectively. Preferably, $RA_{TOTAL}$ is <5 ohm-um² for optimum p-MTJ performance. Since the largest contribution to the total is from the tunnel barrier layer, and the Hk enhancing layer is often underoxidized to avoid exceeding the desired $RA_{TOTAL}$, $RA_{16}$ should provide the smallest RA contribution and is ideally proximate to zero.

Metallic buffer layer 18 is advantageously used as a barrier to oxygen migration out of the adjoining Hk enhancing layer 15, and as a barrier to nitrogen migration from the M1N or M1ON layer 16 to FL 14 so that DRR is not degraded. Typically, the metallic buffer layer is one of the aforementioned M1 alloys or metals.

Alternatively, metal nitride or metal oxynitride layer 16 may be comprised of an insulating metal (M2) nitride or oxynitride where M2 is one of B, Al, Si, Ga, In, or TI that is alloyed with a conductive metal or alloy (M3) selected from one or more of Pt, Au, Ag, Mg, Ca, Sr, Ba, Sc, Y, La, Co, Fe, Mn, Ru, Rh, Ir, Ni, Pd, Zn, Cu, Ti, V, Cr, Zr, Nb, Mo, Hf, Ta, and W to impart conductivity to the resulting M2M3 nitride (M2M3N), or M2M3 oxynitride (M2M3ON). The M2M3N or M2M3ON layers may be formed by sputter depositing M2 and M3 targets in reaction chamber with a plasma generated using a flow of $N_2$ and RIE conditions, or by sputtering a M2M3 alloy, if available, in the presence of nitrogen plasma.

Capping layer 17 may be a single layer of Ta or Ru, or have a Ru/Ta or Ru/Ta/Ru configuration, for example, or may be another metal or alloy known in the art. Generally, the capping layer (or uppermost metal nitride or metal oxynitride layer in the p-MTJ in embodiments of the present disclosure) serves as a reactive ion etch (RIE) or ion beam etch (IBE) mask during patterning of the p-MTJ, and also functions as a barrier to a chemical mechanical polish (CMP) step that is typically employed to planarize an encapsulation layer for insulating p-MTJ cells.

Figure 2:
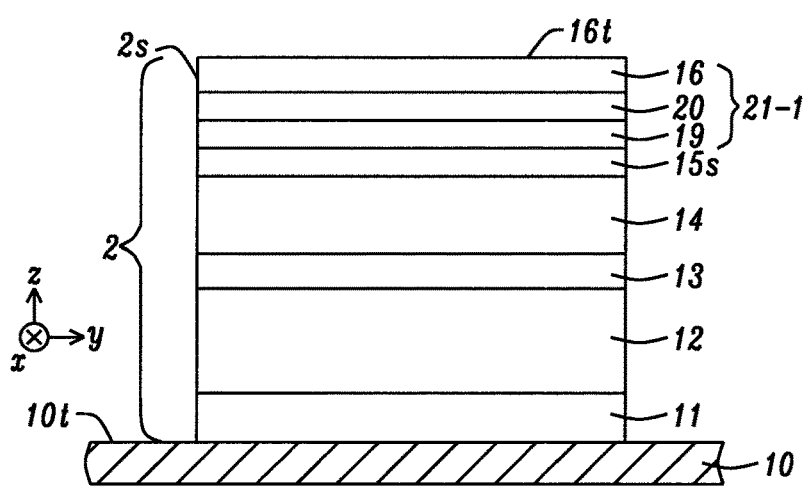
FIG. 2 is a cross-sectional view showing a p-MTJ with a bottom spin valve (bsv) configuration wherein a trilayer NDB is formed on an optional spacer such as a Hk enhancing layer according to an embodiment of the present disclosure.

According to a first embodiment of the present disclosure depicted in FIG. 2 and shown as p-MTJ 2, the NDB in the Reference is replaced with NDB 21-1 having a trilayer scheme with a L2/L1/NL configuration where L2 19 adjoins a top surface of optional spacer 15s, L1 20 is the middle layer, and NL 16 (a MN or MON layer) with top surface 16t is the uppermost layer in the p-MTJ. Seed layer 11, pinned layer 12, tunnel barrier 13, and FL 14 are retained from the Reference. Here, the spacer may be a Hk enhancing layer described previously with a RA value less than that of the tunnel barrier. In other embodiments, the spacer is a metal layer or laminate of one or more elements selected from Ta, W, Pt, Pd, Mo, Hf, Ti, Zr, Nb, V, or other Group IV-Group VII transition elements. In another embodiment, the spacer is a layer or laminate that is one or more of heavy metal elements such as Hf, Ta, W, Pt, or Pd with an absolute value for the Spin Hall Angle (SHA)≥0.1. In yet another embodiment, the spacer is an antiferromagnetic (AFM) based structure such as a IrMn, PtMn, PdMn, or FeMn layer with an absolute value for SHA≥0.1. Optionally, there may be a capping layer 17 (not shown) on NDB 21-1 although in most cases, the NL serves adequately as a capping layer and an additional layer on NL is not necessary.

NL 16 may have any of the M1N, M1ON, M2M3N or M2M3ON compositions described previously where M2 and M3 form a conductive alloy, or M3 forms conductive pathways in a M2N or M2ON insulating matrix as depicted in related patent application Ser. No. 15/881,035. The NL may be the thickest layer in NDB 21-1 in order to function as a hard mask during etching and CMP processes that are used to pattern a p-MTJ stack of layers into a plurality of p-MTJ cells. The NDB has a thickness from 4 Angstroms to 500 Angstroms.

L2 19 is preferably one or more of Mo, W, Ru, Nb, Ta, Cr, Pt, Cu, Au, Ag, Zn, V, Cd, Sn, Ir, Mn, Rh, Co, Fe, CoFe, CoFeB, CoB, FeB, CoFeNi, and CoFeNiB. The first group of the aforementioned metals from Mo to Rh is employed to prevent the diffusion of oxygen from the Hk enhancing layer (when present) to L1 20. Co, Fe, and their alloys are advantageously used in the NL to ensure good crystallization of the Hk enhancing layer during annealing. Thus, L2 is a metal or alloy with a medium to high free energy of oxide formation, preferably in the top half in the Table in FIG. 12. Accordingly, when spacer 15s is a metal oxide or metal oxynitride, oxygen content is retained within the Hk enhancing layer during high temperature annealing up to 400° C., which in turn maintains DRR because of PMA generated by the FL/Hk enhancing layer interface.

Figure 13:
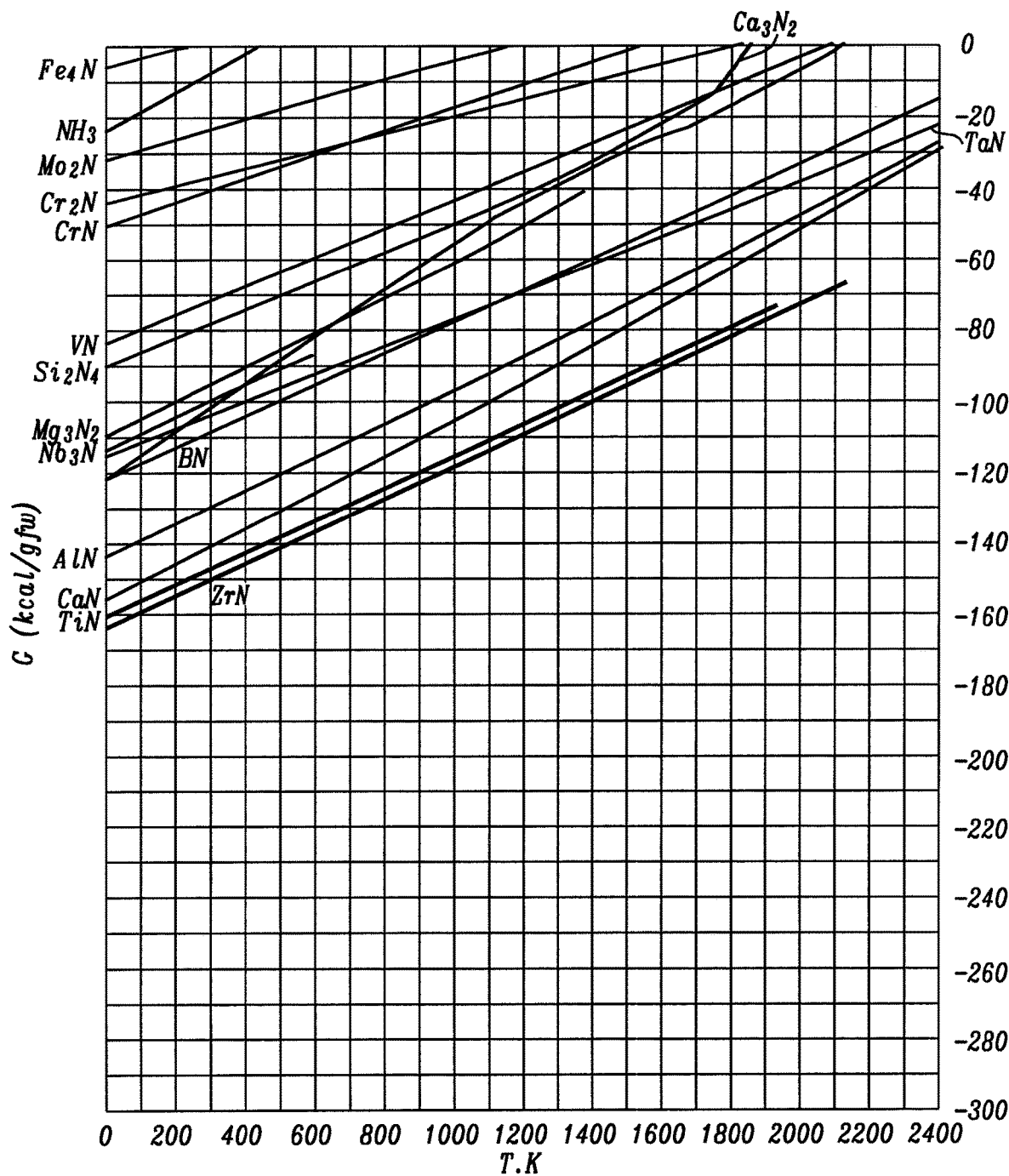
FIG. 13 is a graph with the free energy of formation of various metal nitrides.

L1 is relied upon to block nitrogen diffusion from the MN or MON layer to spacer 15s or to FL 14, and is preferably a metal with a low energy of nitride formation in the graph shown in FIG. 13. Thus, L1 readily reacts with any nitrogen that diffuses from uppermost layer 16 to form L1N. Since a low energy of nitride formation correlates closely with high oxygen gettering capability, L1 is typically a metal such as Ti, Zr, Hf, Nb, Ta, V, Zn, Sr, Ca, and Mn with a low to medium free energy of oxide formation that is less than (more negative) or equal to that of Zn. Accordingly, NDB 21-1 is a more efficient barrier than the Reference since L2 and L1 block oxygen and nitrogen diffusion, respectively, rather than relying on a single layer to do both. Preferably, L2 has a substantially higher free energy of formation than L1, and is different from L1.

Figure 3:
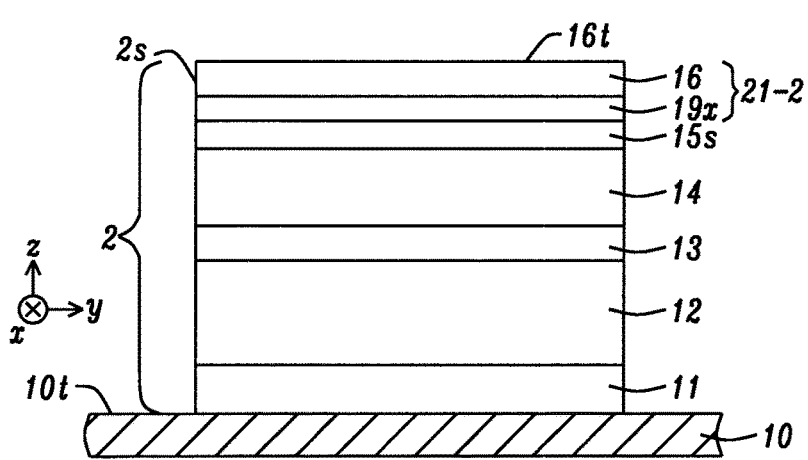
FIG. 3 is a cross-sectional view of a p-MTJ with a bsv configuration that has a bilayer NDB with an upper MN or MON layer and a lower partially oxidized L2 on an optional spacer according to an embodiment of the present disclosure.

The present disclosure also encompasses a second embodiment depicted in FIG. 3 where p-MTJ 2 having sidewall 2s retains all the features described in the previous embodiment except NDB 21-1 is replaced with NDB 21-2 that has a bilayer scheme with a lower oxidized L2 19x and an upper NL 16. The extent of oxidation in L2 depends in part on the presence or absence of a spacer that is a Hk enhancing layer. If a metal oxide spacer 15s is absent, then L2 may be essentially completely oxidized in order to enhance PMA in the free layer by providing a second FL/metal oxide interface. In this case, L2 may be an element proximate to the middle of the table in FIG. 12 that has a medium free energy of oxide formation. On the other hand, if a metal oxide spacer is present, then L2 is preferably underoxidized such that a majority of L2 atoms in the lattice structure remain unoxidized to maintain a significant capability to absorb and react with nitrogen that may diffuse from the MN or MON layer, and also minimize RA for the p-MTJ. Note that a partially oxidized L2 substantially maintains the oxygen content in a metal oxide spacer since any oxygen migration out of the spacer may be offset with diffusion of a certain amount of oxygen from oxidized L2 into the spacer.

Figure 4:
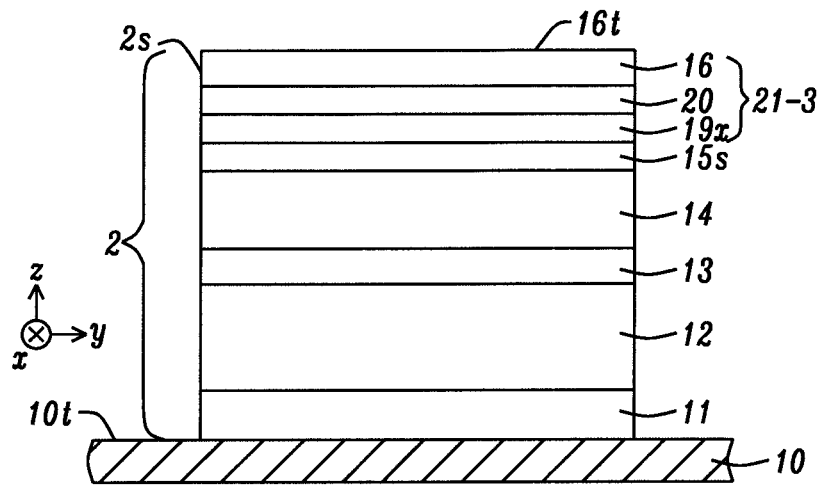
FIG. 4 is a cross-sectional view of the p-MTJ in FIG. 2 where the NDB is modified to have a partially oxidized L2 on the optional spacer according to an embodiment of the present disclosure.

According to a third embodiment shown in FIG. 4, p-MTJ 2 retains all the features of the first embodiment, except NDB 21-1 is replaced with NDB 21-3 where the lower L2 layer in the trilayer scheme is partially oxidized to provide an oxidized L2/L1/NL configuration. The present disclosure anticipates that under certain oxidation conditions, a partially oxidized L2 19x does not have sufficient capability to block nitrogen diffusion from the MN or MON layer 16 to spacer 15s or FL 14. As a result, L1 20 is advantageously used between L2 19x and the uppermost MN or MON layer. Again, the oxidation state in L2 depends on the presence of an optional metal oxide spacer that is a Hk enhancing layer.

Figure 5:
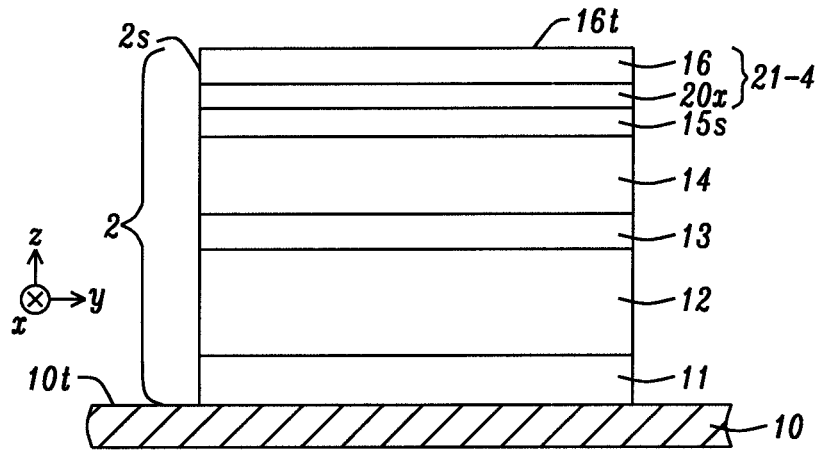
FIG. 5 is a cross-sectional view of a p-MTJ with a bsv configuration that has a bilayer NDB with an upper MN or MON layer and a lower partially oxidized L1 on an optional spacer according to an embodiment of the present disclosure.

A fourth embodiment is shown in FIG. 5 wherein p-MTJ 2 retains all the features of the first embodiment except NDB 21-1 is replaced with NDB 21-4 where the middle L1 layer in the trilayer scheme is partially oxidized to give a L2/oxidized L1/NL configuration. Preferably, a majority of L1 atoms in the lattice remain unoxidized in order to maintain a capability to block nitrogen diffusion from MN or MON layer 16 to optional spacer 15s and FL 14, and minimize RA when a metal oxide spacer 15s is present.

Figure 6:
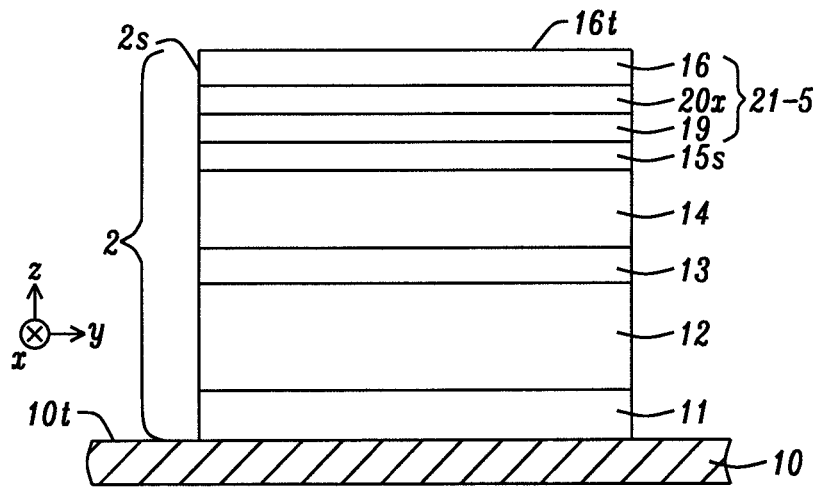
FIG. 6 is a cross-sectional view of the p-MTJ in FIG. 2 where the NDB is modified to have a partially oxidized L1 according to an embodiment of the present disclosure.

According to a fifth embodiment shown in FIG. 6, p-MTJ 2 retains all the features of the fourth embodiment except NDB 21-4 is replaced with NDB 21-5 where the lower L2 layer is omitted to give an oxidized L1/NL configuration. Preferably, a sufficient number of L1 atoms in the partially oxidized L1 20x remain unoxidized in order for the layer to maintain a capability to block nitrogen diffusion from the MN or MON layer 16 to optional spacer 15s and FL 14. If a metal oxide spacer 15s is absent, then a sufficient percentage of L1 atoms in the matrix may be oxidized to enhance PMA in FL 14 by providing a second FL/metal oxide interface similar to the role of an oxidized L2 in the second embodiment. The oxidation state of L1 is also related to the nitrogen blocking power of the L1 element selected. Accordingly, a L1 element that is more reactive (greater blocking power and lower in the graph in FIG. 13) with nitrogen may be more oxidized than a L1 element with a lower blocking power (higher in the graph in FIG. 13) since more unoxidized metal atoms will be needed in the latter case to provide the same nitrogen diffusion blocking efficiency.

Figure 7:
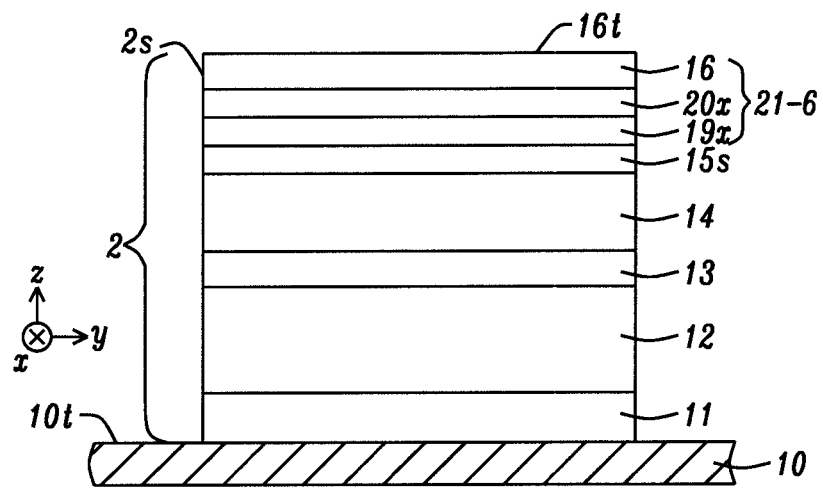
FIG. 7 is a cross-sectional view of the p-MTJ in FIG. 4 where the NDB is modified to have a partially oxidized L1 on the partially oxidized L2 according to an embodiment of the present disclosure.

In a sixth embodiment illustrated in FIG. 7, p-MTJ 2 retains all the features of the first embodiment except NDB 21-1 is replaced with NDB 21-6 wherein both of L1 and L2 in the trilayer scheme are partially oxidized to yield an oxidized L2/oxidized L1/NL configuration. Preferably, a sufficient number of L1 atoms in partially oxidized L1 20x remain unoxidized so the layer maintains a capability to block nitrogen diffusion from the MN or MON layer 16 to spacer 15s or FL 14, and minimizes RA for the p-MTJ. As in the second embodiment, the extent of L2 oxidation depends on the presence or absence of a metal oxide spacer 15s, and the upper limit desired for RA.

Figure 8:
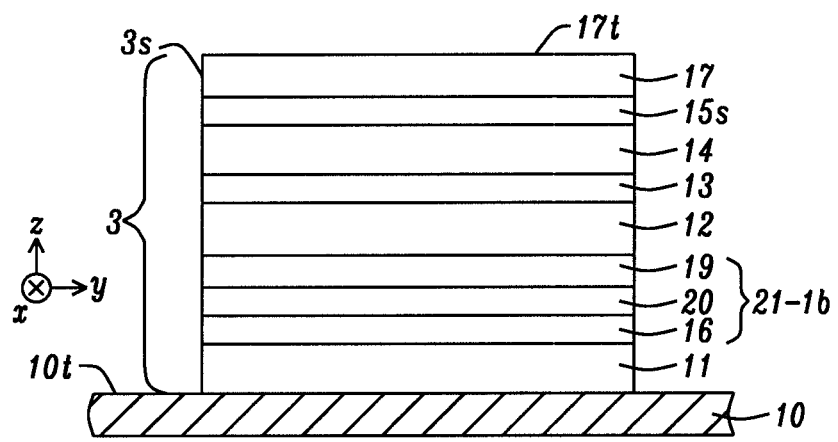
FIG. 8 is a cross-sectional view of a p-MTJ with a bsv configuration where a NDB with a MN or MON/L1/L2 configuration is formed on a seed layer according to an embodiment of the present disclosure.

Referring to FIG. 8, the present disclosure encompasses an embodiment where NDB 21-1 described previously may be employed as a diffusion barrier between seed layer 11 and pinned layer 12. Thus, a p-MTJ 3 is formed having sidewall 3s and wherein NDB 21-1b, pinned layer 12, tunnel barrier 13, FL 14, optional spacer 15s, and capping layer 17 are sequentially formed on seed layer 11. The diffusion barrier is referred to as NDB 21-1b since the stacking order is reversed compared with NDB 21-1 and has a NL/L1/L2 configuration with a MN or MON layer 16 as the bottom layer contacting the seed layer, and uppermost L2 19 contacting the pinned layer. In this case, the NDB is primarily relied upon to block nitrogen diffusion from the NL to the pinned layer thereby preventing a reduction in DRR. In alternative embodiments, the stacking order in one of NDB 21-2 through NDB 21-6 may be reversed and used as the NDB instead of NDB 21-1b.

Figure 9:
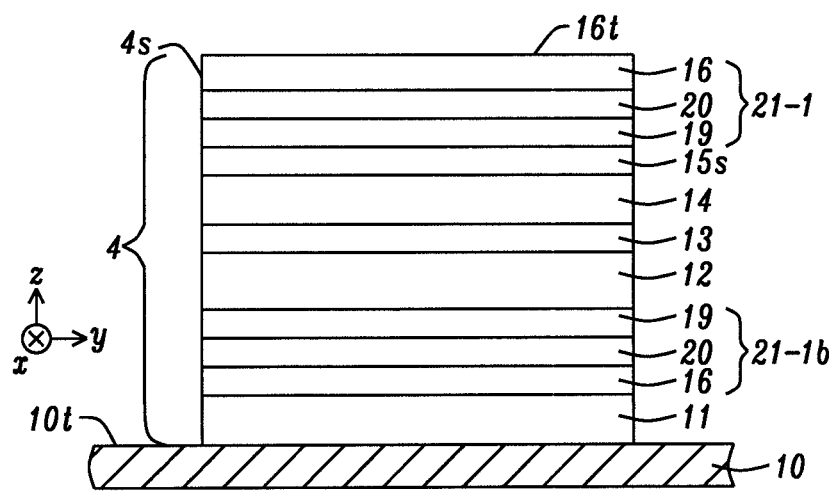
FIG. 9 is a cross-sectional view of the p-MTJ in FIG. 8 where the capping layer is replaced with a second NDB according to an embodiment of the present disclosure.

In FIG. 9, another embodiment is shown where the embodiment in FIG. 8 is modified with the replacement of capping layer 17 with NDB 21-1 described previously. Accordingly, p-MTJ 4 has sidewall 4s and a bottom spin valve configuration where NDB 21-1b, pinned layer 12, tunnel barrier 13, FL 14, optional spacer 15s, and NDB 21-1 are sequentially formed on seed layer 11. Optionally, one of NDB 21-2 through NDB 21-6 may be substituted for NDB 21-1.

Figure 10:
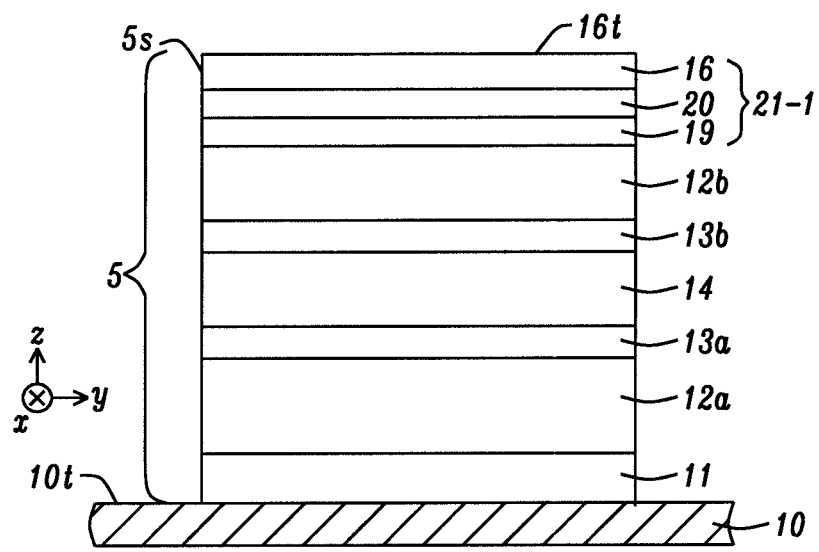
FIG. 10 is a cross-sectional view of a p-MTJ having a dual spin valve configuration where a NDB is formed on a second (upper) tunnel barrier layer according to an embodiment of the present disclosure.

FIG. 10 depicts a dual spin valve configuration according to another embodiment of the present disclosure where p-MTJ 5 with sidewall 5s has a first pinned layer 12a, first tunnel barrier 13a, FL 14, second tunnel barrier 13b, second pinned layer 12b, and NDB 21-1 sequentially formed on seed layer 11. Tunnel barriers 13a, 13b may be comprised of the same material as in tunnel barrier 13 described earlier, and pinned layers 12a, 12b may have the same composition as in pinned layer 12 in previous embodiments. Moreover, one of NDB 21-2 through NDB 21-6 may be substituted for NDB 21-1.

Figure 11:
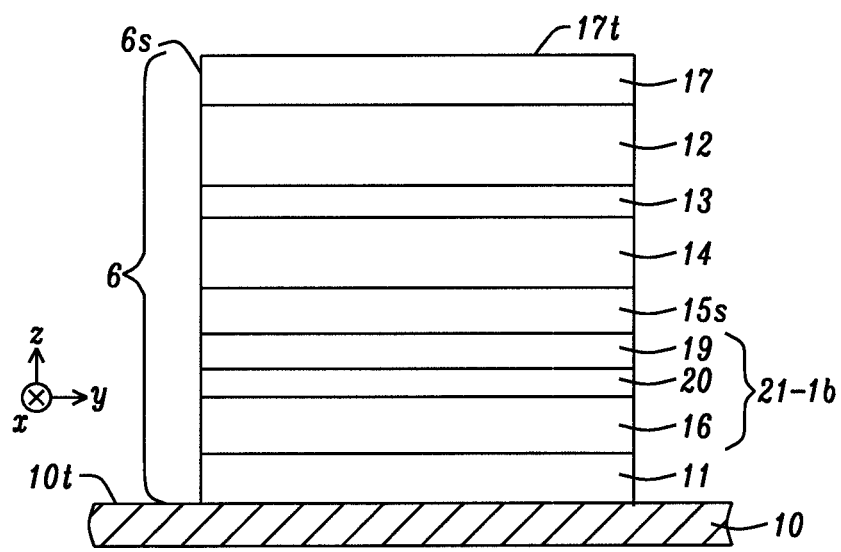
FIG. 11 is a cross-sectional view showing a p-MTJ with a top spin valve configuration wherein a trilayer NDB is formed on a seed layer according to an embodiment of the present disclosure.

In FIG. 11, p-MTJ 6 with sidewall 6s has a top spin valve configuration according to an embodiment of the present disclosure wherein the layers in FIG. 8 are retained but the stacking order is modified such that optional spacer 15s, FL 14, tunnel barrier 13, pinned layer 12, and capping layer 17 are sequentially formed on NDB 21-1b. L2 19 is advantageously used to block oxygen diffusion when the spacer is a metal oxide Hk enhancing layer while L1 20 is a barrier to nitrogen migration from NL 16 to the spacer and FL 14. It should be understood that NDB 21-1b in the exemplary embodiment may be replaced with one of NDB 21-2 through NDB 21-6 that is stacked in the reverse order so that the NL is always the bottommost layer in the NDB on seed layer 11.

We have demonstrated improved p-MTJ performance using a NDB disclosed herein by building p-MTJ stacks with a pinned layer/MgO tunnel barrier/FL/capping layer configuration wherein a nitride capping layer (NL=TiN) in the prior art sample (a) was replaced by L1/NL (Ti/TiN)=sample (b), L2/NL (Mo/TiN)=sample (c), and with NDB 21-1 (Mo/Ti/TiN) from the first embodiment to afford sample (d). Note that a spacer was omitted between the FL and capping layer to rule out all diffusion barrier contributions from a Hk enhancing layer in order to more clearly determine the effect on interlayer mixing for each capping layer or NDB example. Each p-MTJ sample was annealed at 400° C. for 141 minutes and then an Energy-Dispersive X-ray Spectroscopy (EDS) measurement was performed to generate an EDS spectrum to enable a study of elemental composition as a function of depth into the film stack.

EDS spectra for samples (a), (b), (c), and (d) are shown in FIG. 14A, FIG. 14B, FIG. 14C, and FIG. 14D, respectively. Each element/layer is shown as a different curve. Accordingly, L1, L2 and N in the capping layer at the top of one or more of the p-MTJ stacks are farther left on the x-axis while Mg and O in the tunnel barrier and the FL (comprised of upper FM1 layer and lower FM2 layer) near the middle of the p-MTJ stacks are proximate to the x-axis center position. Since the NL composition is L1N, where L1=Ti, L1 also appears in the EDS spectrum for sample (c) in FIG. 14C.

Figure 14A:
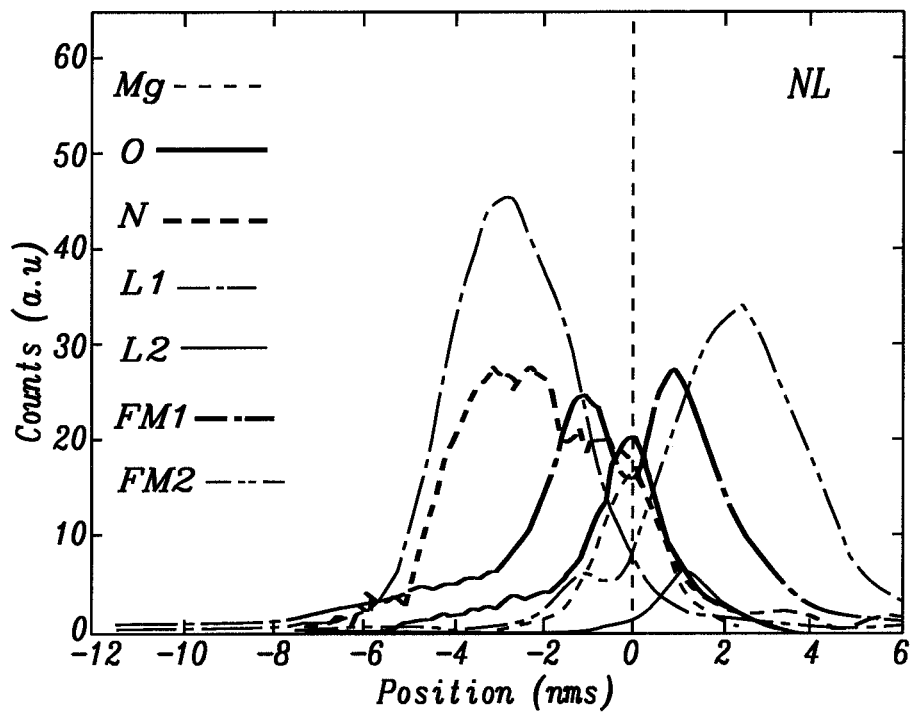
FIGS. 14A-14D are Energy Dispersive X-ray (EDS) spectra of a magnetic film stack having a PL/MgO/FL/capping layer configuration where the capping layer is a nitride layer (NL), L1/NL stack, L2/NL stack, and a L2/L1/NL stack, respectively.

FIG. 14A indicates that when using a single nitride layer (TiN) as the capping layer, nitrogen diffuses through the entire FL (FM1) and into the MgO tunnel barrier. Note that a significant portion of the N curve is below the Mg and O curves, and to the right of the x-axis center position. As shown in Table 1 where row 2 corresponds to sample (a), the FL magnetic moment vanishes and RA increases to >200 ohm-$\mu m^2$. An "x" in row 2 for DRR, Hk, and Ms means none of the aforementioned properties are detected. The results suggest that nitrogen diffusion into the FL leads to the formation of FeN, BN, and CoN alloys during annealing. Furthermore, we observe oxygen diffusion from the MgO barrier through the TiN capping layer as evidenced by a portion of the Mg and O curves at the same x-axis positions as a major portion of the L1 and N curves. Accordingly, we suspect that the NL does not have its original stoichiometry after annealing but is rather nitrogen deficient thereby causing oxygen gettering effects. Note that the number after each element or alloy in the first column of Table 1 indicates the thickness of the layer in Angstroms.

Figure 14B:
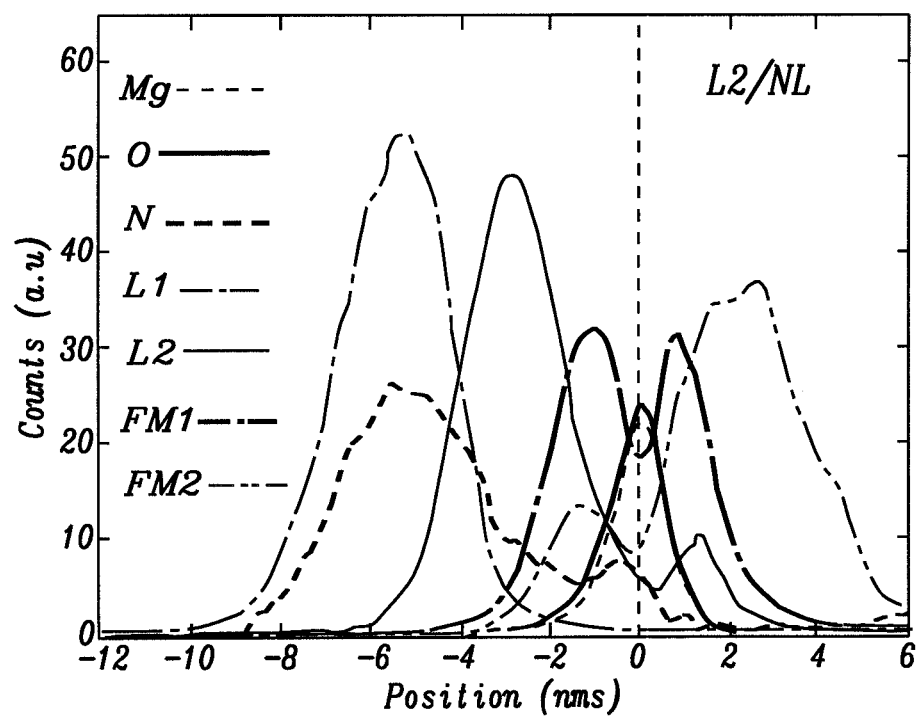
Figure 14C:
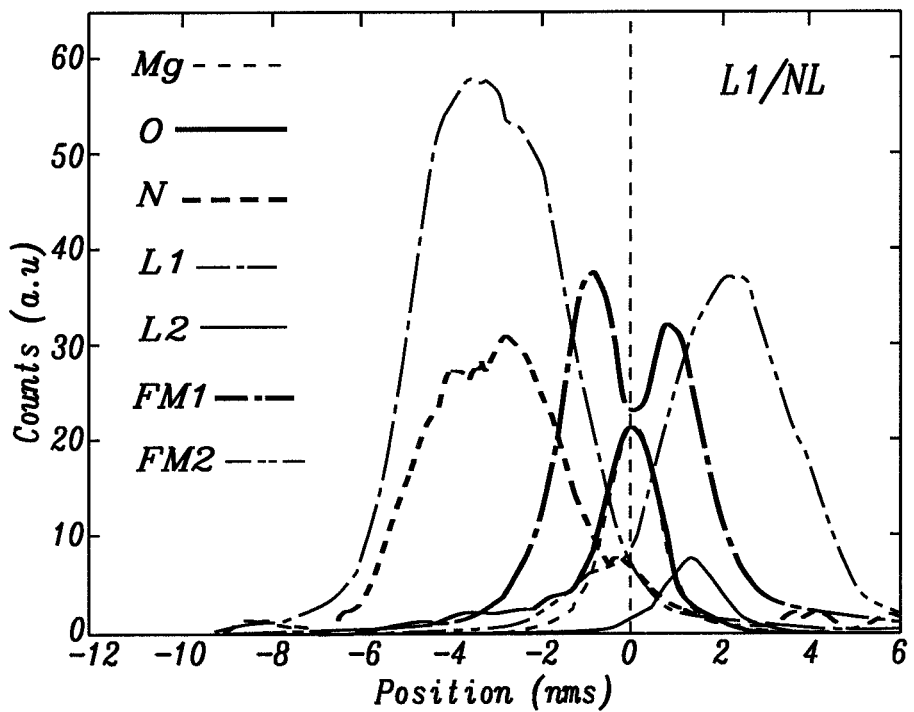

In contrast, when an additional layer (L1 or L2) is added to the capping layer to give sample (b) and sample (c), respectively, nitrogen diffusion into the FL and MgO barrier is largely reduced, although not completely suppressed as shown in FIGS. 14B-14C. In other words, there is still significant overlap of the Mg and O curves with the N curve. As shown in rows 3 and 4 of Table 1, this reduction in nitrogen diffusion is not sufficient to ensure high PMA (preferably Hk>8 kOe), a low RA that is ≤5 ohm-$\mu m^2$, and an acceptable MR proximate to 120%. L1 thickness in the L1/NL stack in row 3 is varied from 3-10 Angstroms to generate a range of RA values from 3-8 ohm-$\mu m^2$, and the range of Hk values. It is also noted that both L1/NL and L2/NL configurations may generate in-plane anisotropy (negative Hk) and not the desired large out-of-plane anisotropy as in row 1, and row 5 corresponding to sample (d).

Figure 14D:
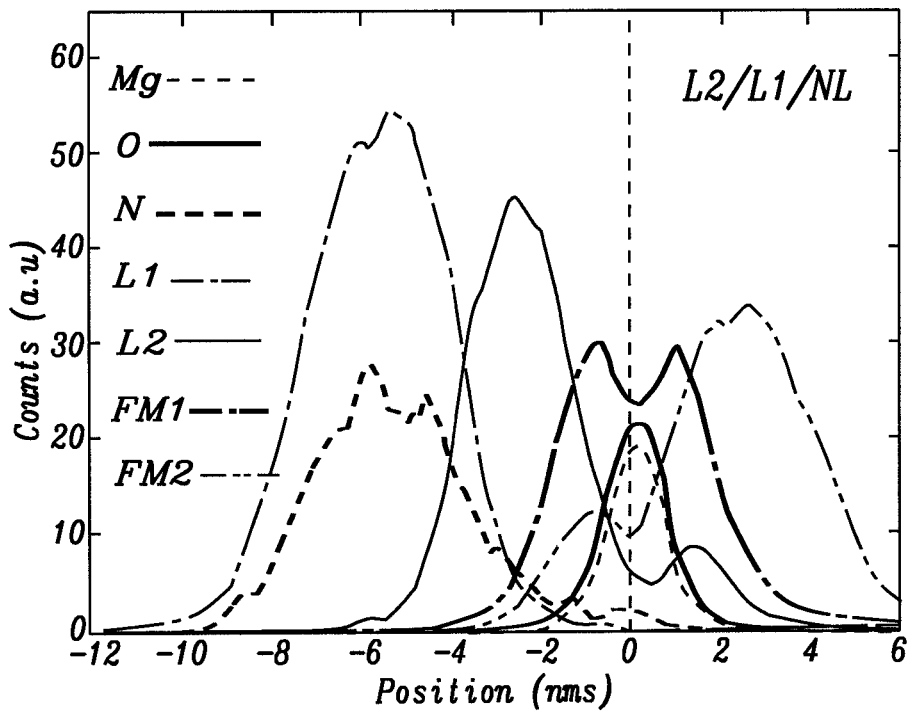

FIG. 14D indicates that when both L1 (Ti) and L2 (Mo) are combined with NL to form a L2/L1/NL NDB according to an embodiment of the present disclosure, essentially no nitrogen is observed in either the FL or MgO tunnel barrier. Moreover, oxygen diffusion from the MgO barrier to the capping layer is substantially blocked. Sample (d) results in row 5 of Table 1 show a Hk=9200 Oe, RA=2 ohm-$\mu m^2$, and MR=118% that are quite similar to the values observed for a single L2 capping layer structure in row 1 of Table 1. Thus, we have demonstrated that both L1 and L2 are preferably used with a metal nitride or metal oxynitride NL to provide a NDB and p-MTJ with optimum performance because of the oxygen diffusion blocking capability of L2 and the nitrogen diffusion blocking capability of L1.

TABLE 1

Magnetic Properties of p-MTJ with a seed/CoFeB/MgO/CoFeB/capping layer configuration

| Capping layer | RA (ohm-$\mu m^2$) | DRR (%) | Hk (kOe) | Ms (emu/cc) |
|---|---|---|---|---|
| L2 = Mo20 | 2.0 | 128 | 8.7 | 820 |
| NL = TiN30 | 215 | x | x | x |
| L1/NL = Ti3-10/TiN30 | 3-8 | 30 | −3 to +1 | 1000 |
| L2/NL = Mo20/TiN30 | 5.0 | x | −2.5 to −0.2 | 350 |
| Mo20/Ti10/TiN30 | 2.0 | 118 | 9.2 | 820 |

The present disclosure also encompasses a method of fabricating a p-MTJ cell described herein. All layers in the p-MTJ cells described herein may be formed in an Anelva C-7100 thin film sputtering system or the like which typically includes multiple physical vapor deposition (PVD) chambers each with a capability for five targets, an oxidation chamber, and a sputter etching chamber. Usually, the sputter deposition process comprises a noble gas such as argon, and oxygen is excluded in the oxidation chamber unless required for tunnel barrier or Hk enhancing layer formation, or for the partial oxidation of L1 and L2. Once all of the layers in the p-MTJ stack are laid down on the bottom electrode, high temperature annealing may be performed in a vacuum oven for 1 to 5 hours at a temperature of about 360° C. to 400° C. to transform the amorphous tunnel barrier and Hk enhancing layer (when present), and amorphous FL into crystalline layers for lattice matching in the tunnel barrier/FL/Hk enhancing layer stack to enhance DRR.

A M1N capping layer may be formed by sputter depositing a M1 target in a reactive environment comprised of N and Ar species where the term "species" is defined as an ion or radical. The M1N (or M1ON) layer may have a non-stoichiometric nitridation state wherein the metal nitride matrix has vacant sites not occupied by M1 or N atoms.

Thereafter, an array of p-MTJ cells may be fabricated by a process involving a conventional photolithography patterning process and reactive ion etch (RIE) and/or ion beam etch (IBE) processes well known in the art. Subsequently, an encapsulation layer (not shown) is deposited to electrically insulate p-MTJ cells. A chemical mechanical polish (CMP) process is typically employed to form a smooth surface on the encapsulation layer that becomes coplanar with a top surface of the hard mask in each p-MTJ cell. Then a top electrode array (not shown) including a plurality of conductive lines (i.e. bit lines or word lines) is formed on the p-MTJ array and encapsulation layer to continue the magnetic device fabrication. During a read or write operation, a current is passed through the p-MTJ from the BE to a top conductive line, or in the reverse direction.

Figure 15:
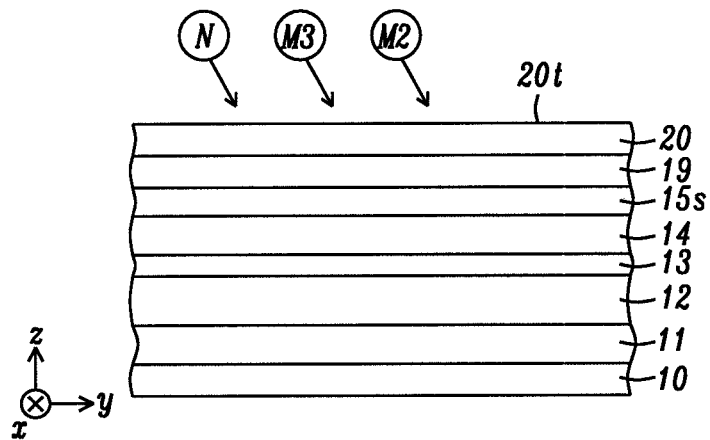
FIGS. 15-18 are cross-sectional views depicting various methods of forming conductive pathways within a metal nitride or metal oxynitride matrix, or a conductive M2M3N or M2M3ON alloy layer according to an embodiment of the present disclosure.

With regard to the formation of a M2M3N or M2M3ON layer 16 in the NDB 21-1 through 21-6 of aforementioned embodiments where the resulting alloy is conductive, or where M3 conductive channels are formed in a M2N or M2ON insulating matrix, one approach is depicted in FIG. 15. M2, M3, and N are co-deposited with a reactive gas environment generated by a chemical vapor deposition (CVD), physical vapor deposition (PVD), or a plasma enhanced CVD (PECVD) method wherein M3 species, M2 species, and nitrogen species N are simultaneously directed at top surface 20t of L1 20, and react to form a film thereon (not shown). The conductive pathways may be formed during the CVD, PVD, or PECVD process, or during a subsequent anneal step that promotes M3 diffusion and conglomeration. It should be understood that the reactive gas environment further includes oxygen species when a M2ON matrix is desired.

Figure 16:
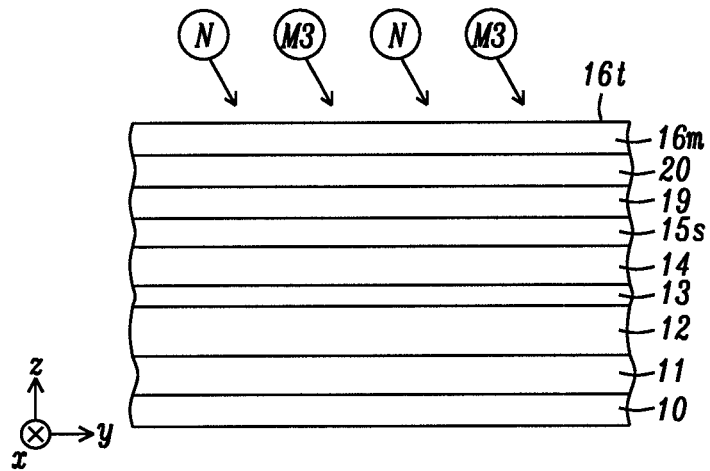

According to an alternative embodiment shown in FIG. 16, a M2 layer 16m with top surface 16t is deposited on L1 20 during a first step. Then, a second step is performed where the reactive gas environment mentioned in the previous embodiment is limited to nitrogen species N and the M3 species to yield a M2M3N layer or M3 channels in a M2N matrix, or is limited to N, O, and M3 species to form a M2M3ON layer or M3 channels in a M2ON matrix.

Figure 17:
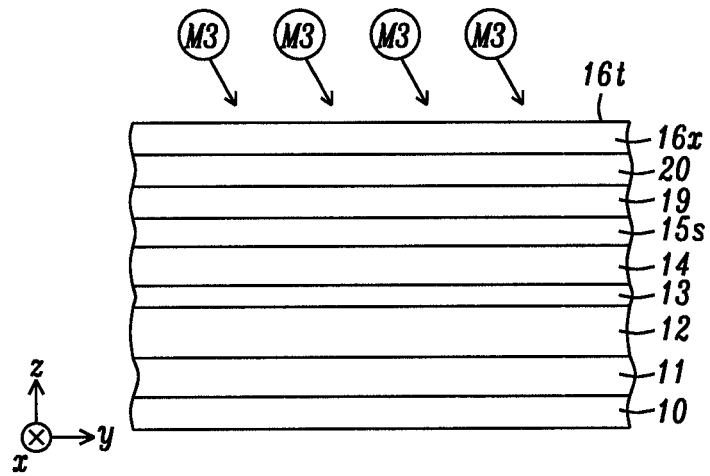

Another embodiment for forming a M2M3N or M2M3ON layer 16 in NDB 21-1 to NDB 21-6 is shown in FIG. 17 where a M2N or M2ON layer 16x is initially deposited on L1 20. Thereafter, a reactive gas environment comprised of M3 species is generated and reacts with layer 16x to provide a M2M3N layer or M3 channels within a M2N matrix, or yields a M2M3ON layer or M3 channels in a M2ON matrix depending on the composition of intermediate layer 16x. Alternatively, the method illustrated in FIG. 17 represents an ion implantation of M3 species into the M2N or M2ON layer. One or more anneal steps may then be used to form conductive M3 channels in a M2N or M2ON matrix, or form a M2M3N or M2M3ON alloy layer.

Figure 18:
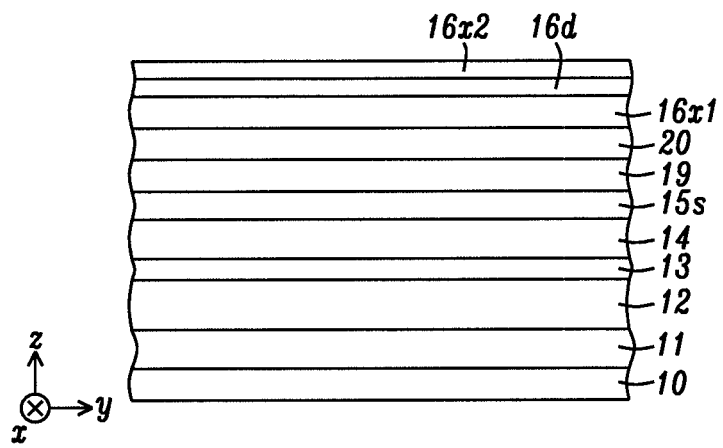

In yet another embodiment depicted in FIG. 18, a trilayer stack of layers 16x1/16d/16x2 is formed on L1 20 where layers 16x1, 16x2 are M2N or M2ON layers while layer 16d is a M3 layer. Optionally one of the 16x1 and 16x2 layers may be omitted to provide a bilayer stack. Thereafter, one or more anneal steps results in diffusion of M3 into the M2N or M2ON layer(s) to form a M2M3N or M2M3ON alloy, or conductive M3 channels in a M2N or M2ON matrix to yield an uppermost NL 16 in NDB 21-1 through NDB 21-6.

In all embodiments, the p-MTJ is patterned by a conventional sequence involving coating a photoresist layer (not shown) on a top surface 16t of metal nitride or metal oxynitride layer 16 in p-MTJ 1, 2, 4, and 5, or on a top surface 17t of hard mask 17 in p-MTJ 3 and 6. Then the photoresist layer is patternwise exposed and developed with a well known lithography process to generate an array of island shapes arranged in rows and columns. Thereafter, one or more IBE or RIE steps are used to transfer the photoresist pattern through the p-MTJ stack to form sidewalls 1s-6s in p-MTJs 1-6, respectively.

Figure 19:
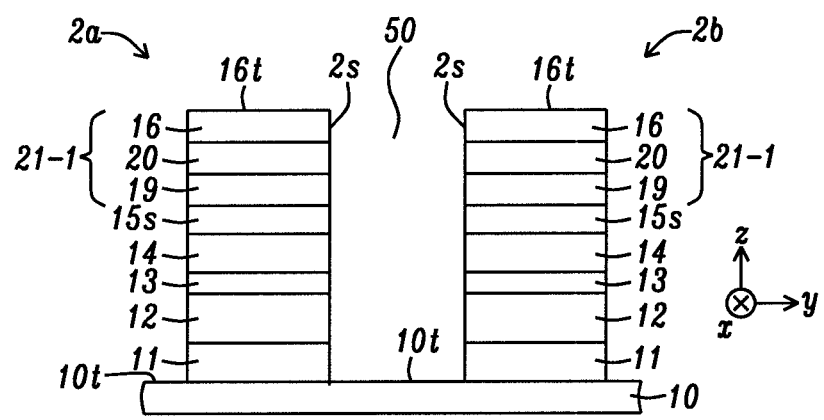
FIG. 19 is a cross-sectional view showing an intermediate step in forming an array of p-MTJ cells on a substrate.

Referring to FIG. 19, a cross-sectional view is illustrated for two adjacent p-MTJs 2a, 2b each having sidewall 2s formed according to the first embodiment described earlier. The one or more IBE and RIE steps have been completed to expose portions of substrate top surface 10t and form opening 50 between the p-MTJs. Typically, the photoresist pattern is etched away as a result of the one or more IBE or RIE steps.

Figure 20:
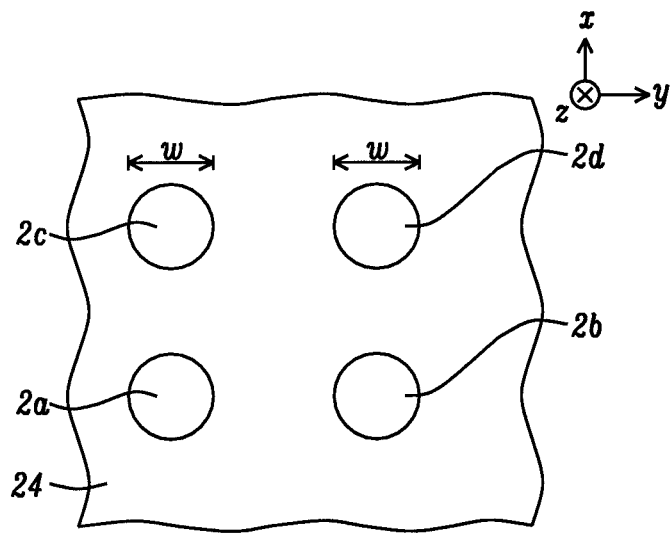
FIG. 20 is a top-down view of a memory array wherein a plurality of p-MTJ cells is insulated by an encapsulation layer according to an embodiment of the present disclosure.

FIG. 20 is a top-down view after patterning the p-MTJ stack to form a plurality of p-MTJs including p-MTJs 2a, 2b described previously and aligned in a first row, and p-MTJs 2c, 2d aligned in a second row. Note that p-MTJs 2a, 2c are in a first column and p-MTJs 2b, 2d are in a second column. An encapsulation layer 24 has been deposited to fill opening 50 in FIG. 19 to insulate adjacent p-MTJs, and a chemical mechanical polish process performed to provide p-MTJ top surfaces that are coplanar with a top surface of the encapsulation layer. In the exemplary embodiment, each p-MTJ has a circular shape with a critical dimension w that may be <100 nm. In other embodiments, each p-MTJ may have an elliptical or polygonal shape wherein an x-axis dimension is different from a y-axis dimension.

All of the embodiments described herein may be incorporated in a manufacturing scheme with standard tools and processes. A considerable gain in overall magnetic performance is achieved in that higher DRR and FL PMA (Hk) are observed while maintaining or lowering RA to further improve 64 Mb and 256 Mb STT-MRAM technology, and related spintronic devices where switching current, RA, DRR, FL PMA, and thermal stability are all critical parameters.

While the present disclosure has been particularly shown and described with reference to, the preferred embodiments thereof, it will be understood by those skilled in the art that various changes in form and details may be made without departing from the spirit and scope of this disclosure.

We claim:

1. A perpendicular magnetic tunnel junction (p-MTJ) structure formed on a substrate, comprising:
   (a) a pinned layer (PL);
   (b) a tunnel barrier layer with a first surface that adjoins the PL, and a second surface that contacts a free layer (FL);
   (c) the FL that has perpendicular magnetic anisotropy (PMA) as a result of a first oxide interface with the tunnel barrier layer; and
   (d) a nitride diffusion barrier (NDB), comprising:
      (1) a nitride layer (NL) that is TaON, WON, NbON, or TiON or has a M1N or M1ON composition where M1 is a metal or alloy that is one or more of V, Cr, Zr, Mo, Hf, and Mg, and is an uppermost layer in the p-MTJ structure wherein the p-MTJ structure has a width "w" determined by a sidewall that extends from a top surface of the NL to a top surface of the substrate; and
      (2) a partially oxidized metal oxide (MOx) layer that adjoins the NL and is formed between the NL and the FL such that a FL/MOx interface is a second oxide interface to induce additional PMA in the FL, wherein M is one or more of Cr, Pt, Cu, Au, Ag, Zn, Cd, Sn, Ir, Rh, and Zr.

2. The p-MTJ of claim 1 wherein the FL is a single layer or a multilayer that is one or more of Co, Fe, CoFe, CoFeB, CoB, FeB, CoFeNi, and CoFeNiB, or alloys thereof.

3. The p-MTJ of claim 2 wherein the FL is further comprised of a metallic insertion layer that is one or more of Al, Au, Ag, Mg, Ca, Sr, Ba, Sc, Y, La, Mn, Ru, Rh, Ir, Pd, Zn, Cu, Ti, V, Cr, Zr, Nb, Mo, Hf, Ta, W, or Pt.

4. The p-MTJ of claim 1 wherein the FL is a Heusler alloy that is one of $Ni_2MnZ$, $Pd_2MnZ$, $Co_2MnZ$, $Fe_2MnZ$, $Co_2FeZ$, $Mn_3Ge$, or $Mn_2Ga$ where Z is one of Si, Ge, Al, Ga, In, Sn, and Sb, or an ordered $L1_0$ or $L1_1$ material that is one of MnAl, MnGa, or RT wherein R is Rh, Pd, Pt, Ir, or an alloy thereof, and T is Fe, Co, Ni or an alloy thereof, or is a rare-earth alloy that is TbFeCo, GdCoFe, FeNdB, or SmCo.

5. The p-MTJ of claim 1 wherein the NDB has a thickness from about 4 Angstroms to 500 Angstroms.

6. The p-MTJ of claim 1 wherein the PL is formed on a seed layer and the NL is the uppermost layer to give a seed layer/PL/tunnel barrier/FL/MOx/NL configuration.

7. The p-MTJ of claim 1 wherein the p-MTJ is part of a non-volatile memory device that is a Magnetic Random Access Memory (MRAM), spin torque (STT)-MRAM, spin orbit torque (SOT)-MRAM, spin torque oscillator, Spin Hall Effect device, magnetic sensor, or a biosensor.

8. A perpendicular magnetic tunnel junction (p-MTJ) structure formed on a substrate, comprising:
   (a) a pinned layer (PL);

(b) a tunnel barrier layer with a first surface that adjoins the PL, and a second surface that contacts a free layer (FL);

(c) the FL that has perpendicular magnetic anisotropy (PMA) as a result of a first oxide interface with the tunnel barrier layer;

(d) a spacer that adjoins the FL on a side thereof that is opposite to the tunnel barrier layer; and (e) a nitride diffusion barrier (NDB) that is an uppermost layer in the p-MTJ structure, wherein the p-MTJ structure has a width "w" determined by a sidewall that extends from a top surface of the NL to a top surface of the substrate comprising:

(1) a nitride layer (NL) that is TaON, WON, NbON, or TiON or has a M1N or M1ON composition where M1 is a metal or alloy that is one or more of V, Cr, Zr, Mo, Hf, and Mg; and (2) a partially oxidized metal oxide (MOx) layer that adjoins the NL and is formed between the NL and the spacer, and wherein M is one or more of Zr, Zn, Sr, Cr, Pt, Cu, Au, Ag, Cd, Ir, Rh, Co, Fe, CoFe, CoFeB, CoB, FeB, CoFeNi, or CoFeNiB.

9. The p-MTJ of claim 8 wherein the FL is a single layer or a multilayer that is one or more of Co, Fe, CoFe, CoFeB, CoB, FeB, CoFeNi, and CoFeNiB, or alloys thereof.

10. The p-MTJ of claim 9 wherein the FL is further comprised of a metallic insertion layer that is one or more of Al, Au, Ag, Mg, Ca, Sr, Ba, Sc, Y, La, Mn, Ru, Rh, Ir, Pd, Zn, Cu, Ti, V, Cr, Zr, Nb, Mo, Hf, Ta, W, or Pt.

11. The p-MTJ of claim 8 wherein the FL is a Heusler alloy that is one of $Ni_2MnZ$, $Pd_2MnZ$, $Co_2MnZ$, $Fe_2MnZ$, $Co_2FeZ$, $Mn_3Ge$, or $Mn_2Ga$ where Z is one of Si, Ge, Al, Ga, In, Sn, and Sb, or an ordered $L1_0$ or $L1_1$ material that is one of MnAl, MnGa, or RT wherein R is Rh, Pd, Pt, Ir, or an alloy thereof, and T is Fe, Co, Ni or an alloy thereof, or is a rare-earth alloy that is TbFeCo, GdCoFe, FeNdB, or SmCo.

12. The p-MTJ of claim 8 wherein the spacer is a Hk enhancing layer that is a single layer or laminate comprised of an oxide or oxynitride of one or more of Mg, Si, Ti, Ba, Ca, La, Al, Mn, V, and Hf.

13. The p-MTJ of claim 8 wherein the spacer is a metal or alloy having an absolute value for a Spin Hall Angle (SHA) that is ≥0.1, or is an antiferromagnetic (AFM) based structure that is an IrMn, PtMn, PdMn, or FeMn layer with an absolute value for SHA that is ≥0.1.

14. The p-MTJ of claim 8 wherein the NDB has a thickness from about 4 Angstroms to 500 Angstroms.

15. The p-MTJ of claim 8 wherein the PL is formed on a seed layer and the NL is the uppermost layer to give a seed layer/PL/tunnel barrier/FL/spacer/MOx/NL configuration.

16. The p-MTJ of claim 8 wherein the p-MTJ is part of a non-volatile memory device that is a Magnetic Random Access Memory (MRAM), spin torque (STT)-MRAM, spin orbit torque (SOT)-MRAM, spin torque oscillator, Spin Hall Effect device, magnetic sensor, or a biosensor.

17. A method of forming a perpendicular magnetic tunnel junction (p-MTJ), comprising:

(a) providing a stack of layers comprised of a pinned layer, tunnel barrier layer, free layer (FL), and spacer that are sequentially formed on a seed layer;

(b) forming a nitride diffusion barrier (NDB) with a L2/L1/NL configuration on the spacer, wherein the NDB comprises:

(1) an oxygen diffusion barrier layer (L2) that is a partially oxidized metal or alloy of Cr, Pt, Cu, Ag, Au, Zn, Cd, Ir, Zr, Sr, Rh, Co, Fe, CoFe, CoFeB, CoB, FeB, CoFeNi, and CoFeNiB that blocks oxygen diffusion to a nitride layer (NL);

(2) a nitrogen diffusion barrier layer (L1) that substantially prevents nitrogen diffusion from the NL to the spacer and FL; and (3) the NL that has a M2M3N or M2M3ON composition where M2 is one of B, Al, Si, Ga, In, and Tl, and M3 is one or more of Pt, Au, Ag, Mg, Ca, Sr, Ba, Sc, Y, La, Co, Fe, Mn, Ir, Ni, Pd, Zn, Cu, Ti, V, Cr, Zr, Nb, Hf, and Ta such that the NL is a conductive alloy layer, or has M3 conductive channels formed in a M2N or M2ON insulating matrix, and is the uppermost layer in the p-MTJ; and (c) annealing the stack of layers to a temperature proximate to 400° C.

18. The method of claim 17 wherein M2M3N is formed by co-depositing M3, M2, and N on L1, or M2M3ON is formed with a co-deposition of M3, M2, N, and O on L1.

19. The method of claim 17 wherein M2M3N is formed by first depositing a M2 layer on L1, and then co-depositing M3 and N, or M2M3ON is formed by first depositing the M2 layer on L1, and then co-depositing M3, O, and N.

20. The method of claim 17 wherein M2M3N is formed by first depositing a M2N layer on L1, and then depositing M3, or M2M3ON is formed by first depositing a M2ON layer on L1, and then depositing M3.

21. The method of claim 16 wherein M2M3N is formed by depositing a first M2N layer on L1, depositing a M3 layer on the first M2N layer, and then depositing a second M2N layer on the M3 layer, or M2M3ON is formed by depositing a first M2ON layer on L1, depositing a M3 layer on the first M2ON layer, and then depositing a second M2ON layer on the M3 layer.

22. A method of forming a perpendicular magnetic tunnel junction (p-MTJ), comprising:

(a) providing a stack of layers comprised of a pinned layer, tunnel barrier layer, free layer (FL), and spacer that are sequentially formed on a seed layer;

(b) forming a nitride diffusion barrier (NDB) with a L2/L1/NL configuration on the spacer, wherein the NDB comprises:

(1) an oxygen diffusion barrier layer (L2) that is a partially oxidized metal or alloy of Cr, Pt, Cu, Ag, Au, Zn, Cd, Ir, Zr, Sr, Rh, Co, Fe, CoFe, CoFeB, CoB, FeB, CoFeNi, and CoFeNIB that blocks oxygen diffusion to a nitride layer (NL);

(2) a nitrogen diffusion barrier layer (L1) that substantially prevents nitrogen diffusion from the NL to the spacer and FL; and (3) the NL that is TaON, NbON, WON, or TiON or has a M1N or M1ON composition where M1 is a metal or alloy that is one or more of V, Cr, Zr, Mo, Hf, and Mg, and is the uppermost layer in the p-MTJ; and (c) annealing the stack of layers to a temperature proximate to 400° C.

23. A perpendicular magnetic tunnel junction (p-MTJ) structure formed on a substrate, comprising:

(a) a pinned layer (PL);

(b) a tunnel barrier layer with a first surface that adjoins the PL, and a second surface that contacts a free layer (FL);

(c) the FL that has perpendicular magnetic anisotropy (PMA) as a result of a first oxide interface with the tunnel barrier layer; and (d) a nitride diffusion barrier (NDB), comprising:

(1) a nitride layer (NL) that is M2M3N or M2M3ON where M2 is one of B, Al, Si, Ga, In, and Tl, and M3 is one or more of Pt, Au, Ag, Mg, Ca, Sr, Ba, Sc, Y, La, Co, Fe, Mn, Ru, Rh, Ir, Ni, Pd, Zn, Cu, Ti, V, Cr, Zr, Nb, Mo, Hf, Ta, and W such that the NL is a conductive alloy layer, or has M3 conductive channels formed in a M2N or M2ON insulating matrix, and is an uppermost layer in the p-MTJ structure wherein the p-MTJ structure has a width "w" determined by a sidewall that extends from a top surface of the NL to a top surface of the substrate; and (2) a partially oxidized metal oxide (MOx) layer that adjoins the NL and is formed between the NL and the FL such that a FL/MOx interface is a second oxide interface to induce additional PMA in the FL, wherein M is one or more of Cr, Pt, Cu, Au, Ag, Zn, Cd, Sn, Ir, Rh, and Zr.

24. A perpendicular magnetic tunnel junction (p-MTJ) structure formed on a substrate, comprising:

(a) a pinned layer (PL);

(b) a tunnel barrier layer with a first surface that adjoins the PL, and a second surface that contacts a free layer (FL);

(c) the FL that has perpendicular magnetic anisotropy (PMA) as a result of a first oxide interface with the tunnel barrier layer;

(d) a spacer that is a metal oxide or metal oxynitride and adjoins the FL on a side thereof that is opposite to the tunnel barrier layer thereby forming a second oxide interface with the FL; and (e) a nitride diffusion barrier (NDB) that is an uppermost layer in the p-MTJ structure, wherein the p-MTJ structure has a width "w" determined by a sidewall that extends from a top surface of the NL to a top surface of the substrate comprising:

(1) a nitride layer (NL) that has a M2M3N or M2M3ON composition where M2 is one of B, Al, Si, Ga, In, and Tl, and M3 is one or more of Pt, Au, Ag, Mg, Ca, Sr, Ba, Sc, Y, La, Co, Fe, Mn, Ru, Rh, Ir, Ni, Pd, Zn, Cu, Ti, V, Cr, Zr, Nb, Mo, Hf, Ta, and W such that the NL is a conductive alloy layer, or has M3 conductive channels formed in a M2N or M2ON insulating matrix; and (2) a partially oxidized metal oxide (MOx) layer that adjoins the NL and is formed between the NL and the spacer, and wherein M is one or more of Zr, Nb, Ta, Zn, Sr, Cr, Cu, Au, Ag, Cd, Sr, Ir, Co, Fe, CoFe, CoFeB, CoB, FeB, CoFeNi, or CoFeNiB.

* * * * *